(12) United States Patent
Kursun et al.

(10) Patent No.: US 7,855,578 B2
(45) Date of Patent: Dec. 21, 2010

(54) DOMINO LOGIC CIRCUIT TECHNIQUES FOR SUPPRESSING SUBTHRESHOLD AND GATE OXIDE LEAKAGE

(75) Inventors: Volkan Kursun, Fitchburg, WI (US); Zhiyu Liu, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 210 days.

(21) Appl. No.: 11/701,061

(22) Filed: Jan. 31, 2007

(65) Prior Publication Data

US 2007/0176642 A1 Aug. 2, 2007

Related U.S. Application Data

(60) Provisional application No. 60/764,739, filed on Feb. 1, 2006.

(51) Int. Cl.
H03K 19/096 (2006.01)
(52) U.S. Cl. .......................................... 326/98; 326/95
(58) Field of Classification Search .................. 326/26, 326/27, 46, 82, 93–98, 112, 119, 121
See application file for complete search history.

(56) References Cited

U.S. PATENT DOCUMENTS

| | | | | |
|---|---|---|---|---|
| 5,528,064 A | * | 6/1996 | Thiel et al. | 257/362 |
| 6,002,292 A | * | 12/1999 | Allen et al. | 327/379 |
| 6,246,266 B1 | * | 6/2001 | Bosshart | 326/98 |
| 6,545,512 B2 | * | 4/2003 | Nowka | 327/108 |
| 6,900,666 B2 | * | 5/2005 | Kursun et al. | 326/95 |
| 7,268,590 B2 | * | 9/2007 | Kao et al. | 326/95 |
| 7,282,960 B2 | * | 10/2007 | Belluomini et al. | 326/121 |
| 2004/0041590 A1 | * | 3/2004 | Bernstein et al. | 326/95 |

OTHER PUBLICATIONS

G. Yang et al., "Leakage-Proof Domino Circuit Design for Deep Sub-100nm Technologies," 17th Interntional Conference on VLSI Design (VLSID '04).

M. Allam et al., "High-Speed Dynamic Logic Styles for Scaled-Down CMOS and MTCMOS Technologies," ISLPED 2000; Rapallo, Italy; pp. 155-160.

S. Heo et al., "Leakage-Biased Domino Circuits for Dynamic Fine-Grain Leakage Reduction," 2002 Symposium On VLSI Circuits Digest of Technical Papers; pp. 316-319.

J. Kao, "Dual Threshold Voltage Domino Logic," Solid-State Circuits Conference, 1999; Sep. 21-23, 1999; pp. 118-121.

V. Kursun et al., "Node Voltage Dependent Subthreshold Leakage Current Characteristics of Dynamic Circuits," 2004 IEEE.

(Continued)

Primary Examiner—Rexford N Barnie
Assistant Examiner—Crystal Hammond
(74) Attorney, Agent, or Firm—Boyle Fredrickson, S.C.

(57) ABSTRACT

Circuits are provided for simultaneously reducing the subthreshold and gate oxide leakage power consumption in domino logic circuits. Sleep transistors and a dual threshold voltage CMOS technology may be utilized to place idle domino logic circuits into a low leakage state. The circuits may significantly lower the total leakage power as compared to the standard dual threshold voltage domino logic circuits at both the high and low die temperatures. The energy overheads of the circuit techniques may be low, justifying the activation of the proposed sleep schemes by providing net savings in total power consumption during short idle periods.

8 Claims, 19 Drawing Sheets

OTHER PUBLICATIONS

V. Kursin et al., "Sleep Switch Dual Threshold Voltage Domino Logic With Reduced Standby Leakage Current," IEEE Transactions on Very Large Scale Integration (VLSI) Systems, vol. 12, No. 5, May 2004; pp. 485-496.

Z. Liu, et al., "Shifted Leakage Power Characteristics of Dynamic Circuits Due to Gate Oxide Tunneling," 2005 IEEE; pp. 151-154.

Z. Liu et al., "Temperature Dependent Leakage Power Characteristics of Dynamic Circuits in Sub-65 nm CMOS Technologies," 2005 IEEE; pp. 551-554.

* cited by examiner

DOMINO LOGIC CIRCUIT TECHNIQUES FOR SUPPRESSING SUBTHRESHOLD AND GATE OXIDE LEAKAGE

PRIORITY CLAIM

This application claims the benefit of priority from U.S. Provisional Application No. 60/764,739, filed Feb. 1, 2006, which is incorporated by reference herein in its entirety.

FIELD

The present application relates to a method and apparatus for reducing power consumption, and specifically a method and apparatus for reducing subthreshold and gate oxide leakage power consumption in domino logic circuits.

BACKGROUND

Domino logic circuits have been used in modern high performance microprocessors because of the superior speed and area characteristics of the dynamic circuits as compared to the static CMOS circuits. However, the domino logic gates used in the domino logic circuit typically consume more dynamic switching power and display weaker noise immunity as compared to the static CMOS gates used in the static CMOS circuits.

The domino logic circuits may include: (1) a precharge circuit that pre-charges one or more nodes in the circuit to a predetermined value; (2) a keeper circuit that keeps or maintains the node in the circuit at the predetermined value; (3) an input circuit that inputs one or more signals and that determines the value to output on the output circuit; and (4) an output circuit.

One example of a two-stage domino circuit is shown in FIG. 1. The pre-charge circuit comprises a pull-up transistor (pull-up). When the Clk signal goes low, the dynamic note is precharged via the pull-up transistor to approximately $V_{DD}$ (such as $V_{DD}$–0.7V). After the Clk signal goes high, the dynamic node may decrease due to leakage current, such as leakage via the input circuit. In order to maintain the dynamic node at its precharged value, a keeper circuit (keeper) may be used. One example of a keeper circuit, with an inverter in combination with a switch, is illustrated in FIG. 1. The domino circuit may also include an input circuit, which may include logic for inputting one or more signals and determining the value to output on the output circuit. Any logic may be used for the input circuit including OR, AND, NAND, NOR, XOR, etc. For example, FIG. 1 shows an OR input circuit whereby if $In_1$ or $In_2$ is high, the input circuit pulls down the dynamic node to approximately ground. The domino circuit may further include an output circuit. The output circuit may, at its input, be connected to or in communication with the dynamic mode, and at its output, be connected to the next stage of the circuit. For example, the output of the output circuit may be connected to the next stage of the domino logic circuit, such as shown in FIG. 1.

In the MOS technologies with a gate insulator thicker than 20 Å, the gate oxide leakage current ($I_{gate}$) may be orders of magnitude smaller than the subthreshold leakage current. Therefore, the $I_{gate}$ has typically been ignored in the previous MOS technologies. $I_{gate}$ may be caused by the direct tunneling of the electrons and holes through the insulating gate dielectric layer. The tunneling probability of carriers may increase dramatically with the scaling of the gate oxide thickness ($t_{ox}$) in each new technology generation. The $t_{ox}$ is in the range of 12 Å to 16 Å in the current MOS technologies. Such a thin $t_{ox}$ may lead to a significant gate tunneling current. Particularly at the low die temperatures during long idle periods, most of the power consumption may occur due to gate oxide leakage.

FIG. 1 attempts to reduce the leakage current using three low-$V_t$/high-$V_t$ sleep transistors. In the figures, the high-$V_t$ transistors are represented by a thick line in the channel region. As shown in FIG. 1, NMOS/PMOS sleep switches are utilized to force both the dynamic and output nodes of a domino logic circuit into a low voltage state in the standby mode. Two low-$V_t$ NMOS sleep transistors N1 and N2 are located at both the dynamic and output nodes, respectively, as illustrated in FIG. 1.

In the active mode, the sleep signal is set low. The circuit shown in FIG. 1 thus operates in the active mode similarly to a standard domino logic circuit. In the standby mode, the clock may be gated high. The sleep signal is set high, thereby turning on N1 and N2. The dynamic and output nodes are discharged through N1 and N2, respectively. P3 is cut-off to avoid a static DC current path through P4 and N2. Two additional examples of domino logic circuits with the NMOS/PMOS sleep switch technique are shown in FIGS. 2 and 3. FIG. 2 depicts a schematic of a footless NMOS/PMOS sleep switch dual-$V_t$ domino gate. FIG. 3 depicts a schematic of a footed NMOS/PMOS sleep switch dual-$V_t$ domino gate. Specifically, NMOS transistor N3 acts to make the circuit footed.

While the circuits depicted in FIGS. 1-3 reduce leakage current, they require additional area for the three sleep transistors. Thus, there is a need to reduce the leakage currents, particularly in the context of domino logic circuits, using less circuit area.

BRIEF SUMMARY

In one aspect of the invention, a domino logic circuit is provided that reduces subthreshold and/or gate oxide leakage power consumption. The domino logic circuit may include one or more stages, with each stage having a precharge circuit (such as a pull-up transistor) for precharging a dynamic node to a predetermined value, an input circuit comprising logic (such as OR, AND, etc.) for determining a value of the dynamic node, an output circuit (such as an inverter or a compound gate) and a sleep circuit. The domino logic circuit may further include a keeper circuit for keeping the dynamic node at the predetermined value after the precharge circuit precharges the dynamic node to the predetermined value.

The sleep circuit in the one or more stages consists of a single sleep transistor and may inhibit current to a part of the domino logic circuit (such as to the output circuit, the keeper circuit, etc.) during a sleep mode. For example, the sleep transistor may be in a circuit path between a supply voltage (such as $V_{DD}$) and the output circuit and may reduce or eliminate the current through the output circuit when the circuit is in sleep mode. In a multiple stage domino logic circuit, the multiple stages may use the same sleep transistor to inhibit a static DC current path in each of the output circuits of the multiple stages. As another example, the sleep transistor may be in a circuit path between a supply voltage and the keeper circuit. Even with a sleep circuit, the keeper circuit may consist of a single transistor, with an input connected to the domino circuit output. In a multiple stage domino logic circuit, the multiple stages may use the same sleep transistor to inhibit a static DC current path in each of the keeper circuits of the multiple stages. Further, the same single sleep transistor may be used to inhibit the static DC current path in the keeper circuits and output circuits in each of the multiple stages. In this manner, a single sleep transistor, with a size on the order of other transistors in the circuit, may be used to inhibit a static DC current in the keeper and output circuits in each of the multiple stages.

Further, the sleep circuit, whether composed of one or more transistors, may be PMOS transistors, thereby reducing the leakage current. The one or more PMOS transistors may have a higher threshold than other transistors in the circuit.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE EMBODIMENTS

Feature size scaling in MOSFETs may require reducing both the supply and/or threshold voltages. The lowering of threshold voltages may lead to an increase in the subthreshold current, such as an exponential increase in the subthreshold leakage current.

Circuits are disclosed with low speed, area, and energy overhead that may reduce the subthreshold and/or gate oxide leakage currents in domino logic circuits. In one aspect, sleep transistors may be utilized, either alone, or along with a dual threshold voltage (dual-$V_t$) CMOS technology to force the dynamic and/or output nodes of an idle domino logic circuit into a low voltage state. After the node voltages settle, the circuits may ensure that an idle domino circuit is placed into a low subthreshold and/or gate oxide leakage current state. The circuits may reduce the total leakage power consumption as compared to the standard dual-$V_t$ domino logic circuits at both high and low die temperatures.

In one aspect, PMOS/NMOS sleep switch dual-$V_t$ domino logic circuits may be used. Specifically, dual-$V_t$ transistors may be employed for subthreshold leakage current reduction in domino logic circuits. The important signal transitions that determine the delay of a domino logic circuit may occur along the evaluation path. In a dual-$V_t$ domino circuit, therefore, all of the transistors that may be activated during the evaluation phase may have a low-$V_t$. Alternatively, the precharge phase transitions may not be important for the performance of a domino logic circuit. Therefore, those transistors that are active during the precharge phase may have a high-$V_t$.

Provided that some or all of the high-$V_t$ transistors are cut-off in a dual-$V_t$ domino logic circuit, the subthreshold leakage current may be significantly reduced as compared to a low-$V_t$ circuit. The clock may be gated high, turning off the high-$V_t$ pull-up transistor when a domino logic circuit is idle. In a standard dual-$V_t$ domino logic circuit, the modes of the remaining high-$V_t$ transistors (other than the pull-up transistors) may be determined by the input vectors applied after the clock is gated high.

A dual-$V_t$ domino gate may be placed into a low dynamic node voltage state in order to cut-off the high-$V_t$ transistors, thereby reducing the subthreshold leakage current. The output node of a domino logic circuit may also be placed into a low voltage state in order to suppress the gate oxide leakage currents in the fan-out gates.

Figure 4:
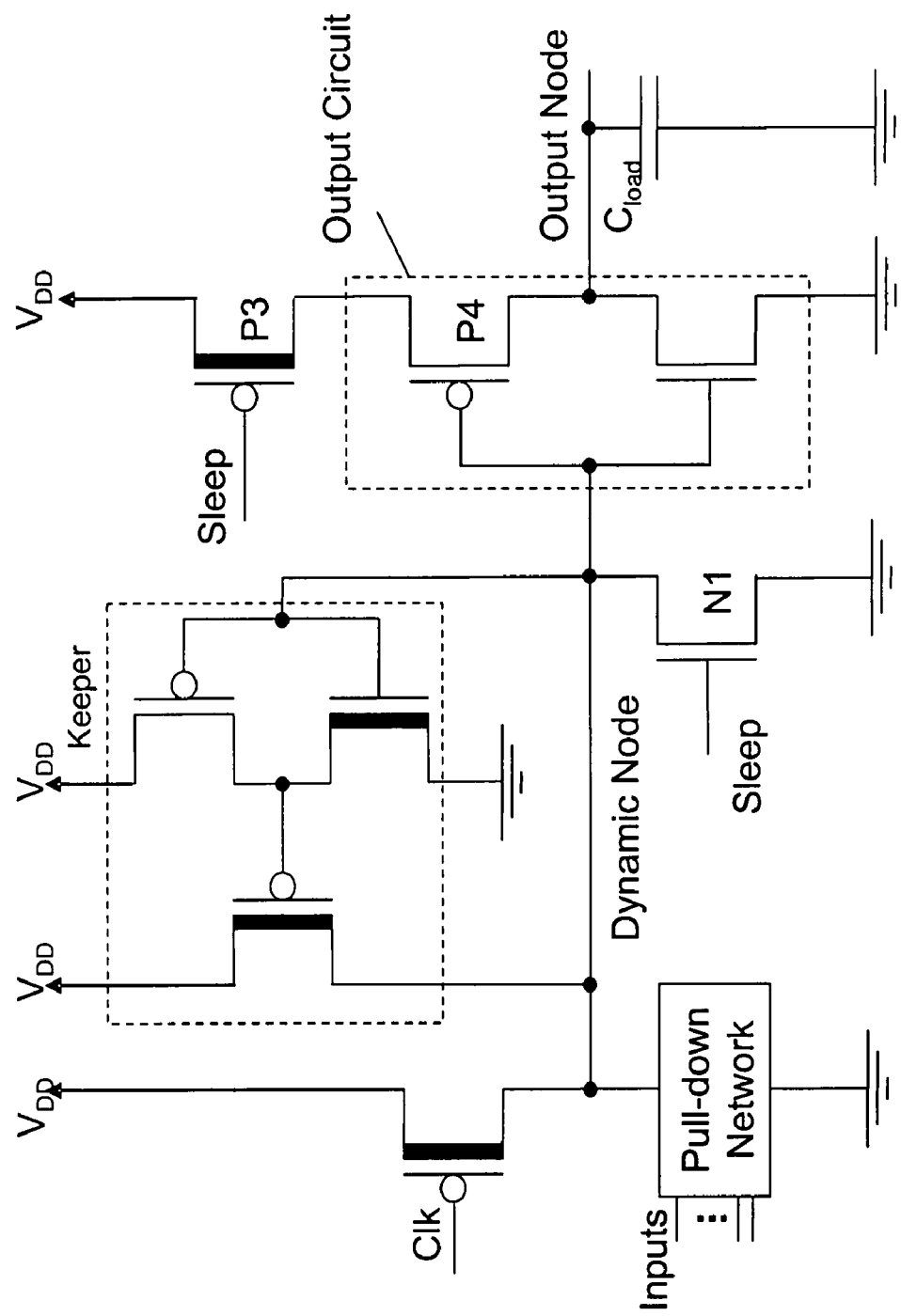
FIG. 4 is a schematic of a footless dual-$V_t$ domino logic circuit, with a sleep circuit comprising NMOS/PMOS sleep switches without a sleep switch at the output node.
Figure 5:
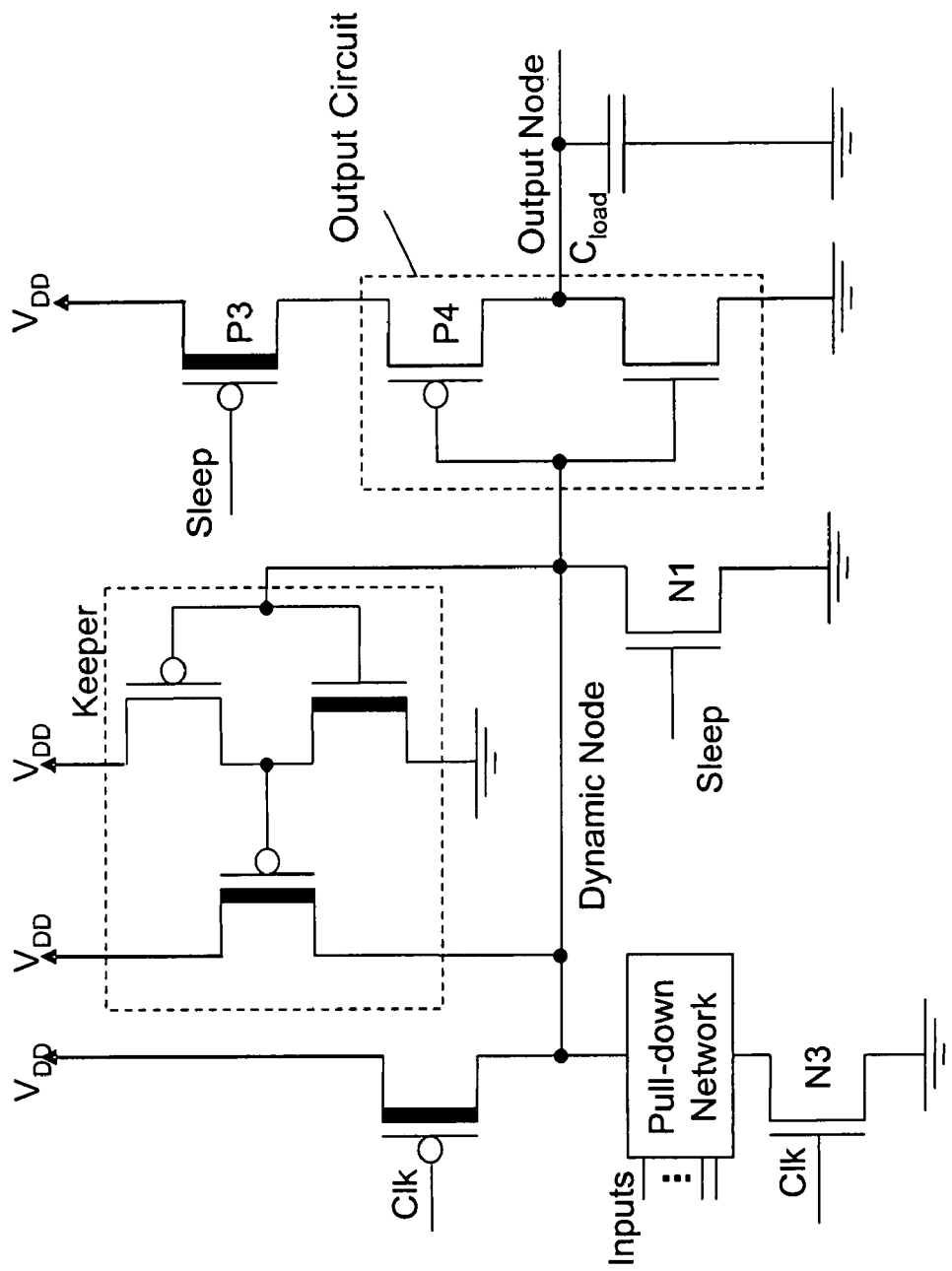
FIG. 5 is a schematic of a footed dual-$V_t$ domino logic circuit, with a sleep circuit comprising NMOS/PMOS sleep switches without a sleep switch at the output node.

FIGS. 4 and 5 depict examples of circuits with smaller area, delay, and power overhead. As shown in FIGS. 4 and 5, one stage of the domino logic circuit may include an input circuit (shown as pull-down network), a keeper circuit, an output circuit, and a sleep circuit (shown as sleep transistors N1 and P3). Though the domino logic circuit includes a keeper circuit, a keeper circuit may not be necessary for the domino logic if the dynamic node sufficiently maintains its charge during operation of the domino logic circuit. For example, if the switching of the domino logic circuit is faster than the time for discharge of the dynamic mode, the keeper may not be necessary to maintain the dynamic node at the precharged value.

FIG. 4 depicts a schematic of a footless NMOS/PMOS sleep switch dual-$V_t$ domino gate without a sleep switch at the output node. FIG. 5 depicts a schematic of a footed NMOS/PMOS sleep switch dual-$V_t$ domino gate without a sleep switch at the output node. In FIGS. 4 and 5, the sleep switch at the output node of the NMOS/PMOS sleep switch domino gate is removed, thereby reducing the capacitive load at the output node, the area overhead, and the energy overhead for activating/deactivating the sleep transistors. In the active mode, the sleep signal may be low. The circuits in FIGS. 4 and 5 may thus operate in the active mode similarly to a standard domino circuit. In the standby mode, the sleep signal may transition to high. The dynamic node may be discharged by N1. P3 may be cut-off and the output node may be discharged by the subthreshold leakage current produced by the output inverter and the gate oxide leakage current conducted by the fan-out gates.

Figure 6:
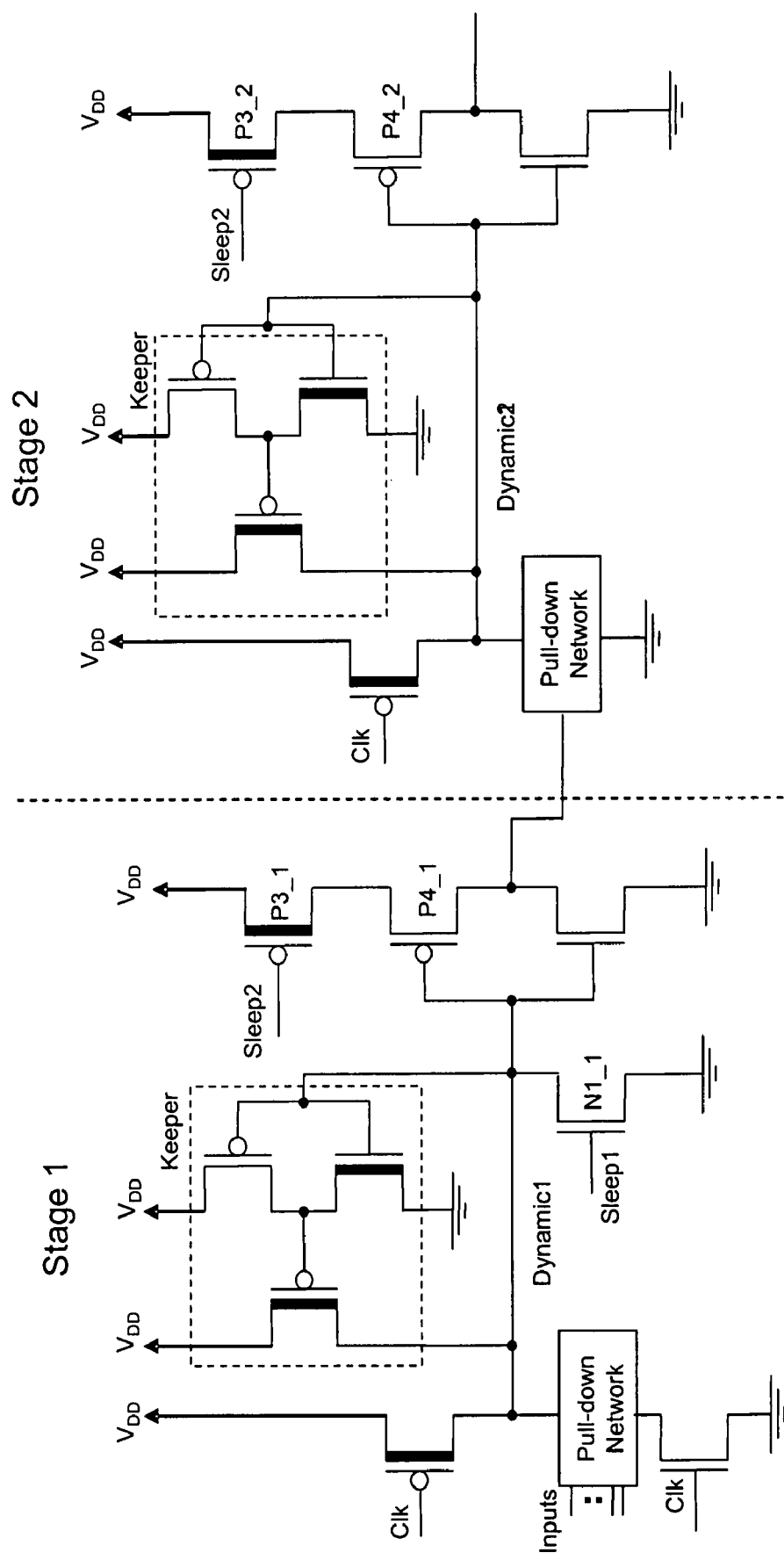
FIG. 6 is a schematic of a multiple stage dual-$V_t$ domino logic circuit, with a sleep circuit comprising NMOS/PMOS sleep switch without the sleep switches at the dynamic and output nodes in the second and later stages.
Figure 19:
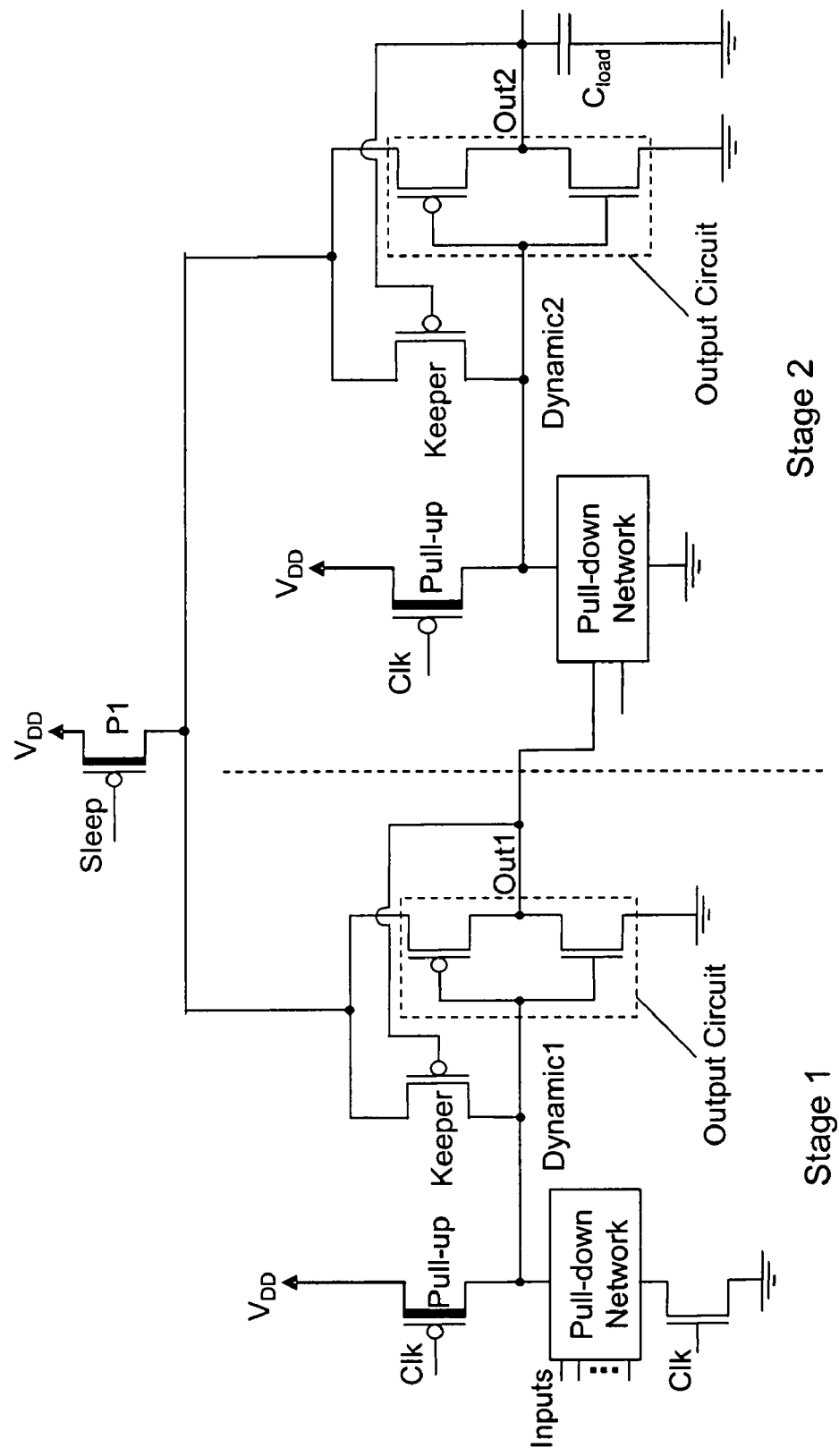
FIG. 19 is a schematic of a domino logic circuit having multiple stages, with a single PMOS sleep switch being used for the multiple stages.

To further reduce the number of sleep switches (in order to reduce the area, delay, and power overhead), the sleep transistors at the dynamic nodes of the domino gates in the second and/or later stages may also be removed in a multiple stage circuit, as illustrated in FIG. 6. FIG. 6 depicts a schematic of a multiple stage NMOS/PMOS sleep switch dual-$V_t$ domino logic circuit without the sleep switches at the dynamic and output nodes in the second and/or later stages. In the active mode Sleep1 and Sleep2 may both be maintained low. When a domino gate enters the idle mode, the clock may be gated high. Sleep1 may be asserted, thereby discharging and charging, respectively, the dynamic and output nodes of the domino gates at the first stage in a domino logic circuit. The high output signals may activate the pull-down network transistors in the fan-out gates. The dynamic and output nodes of the domino gates in the later stages may be discharged and charged, respectively, in a "domino" fashion. After all of the dynamic nodes are discharged, Sleep2 may be asserted to cut-off the pull-up path of all of the output inverters in the domino logic circuits. Finally, the output nodes may be discharged by the subthreshold leakage current produced by the output inverters and the gate oxide leakage current conducted by the fan-out gates. The PMOS sleep switch at the pull-up path of the output inverter may be shared by multiple gates in order to further reduce the circuit area overhead. An example of this is shown in FIG. 19.

Figure 1:
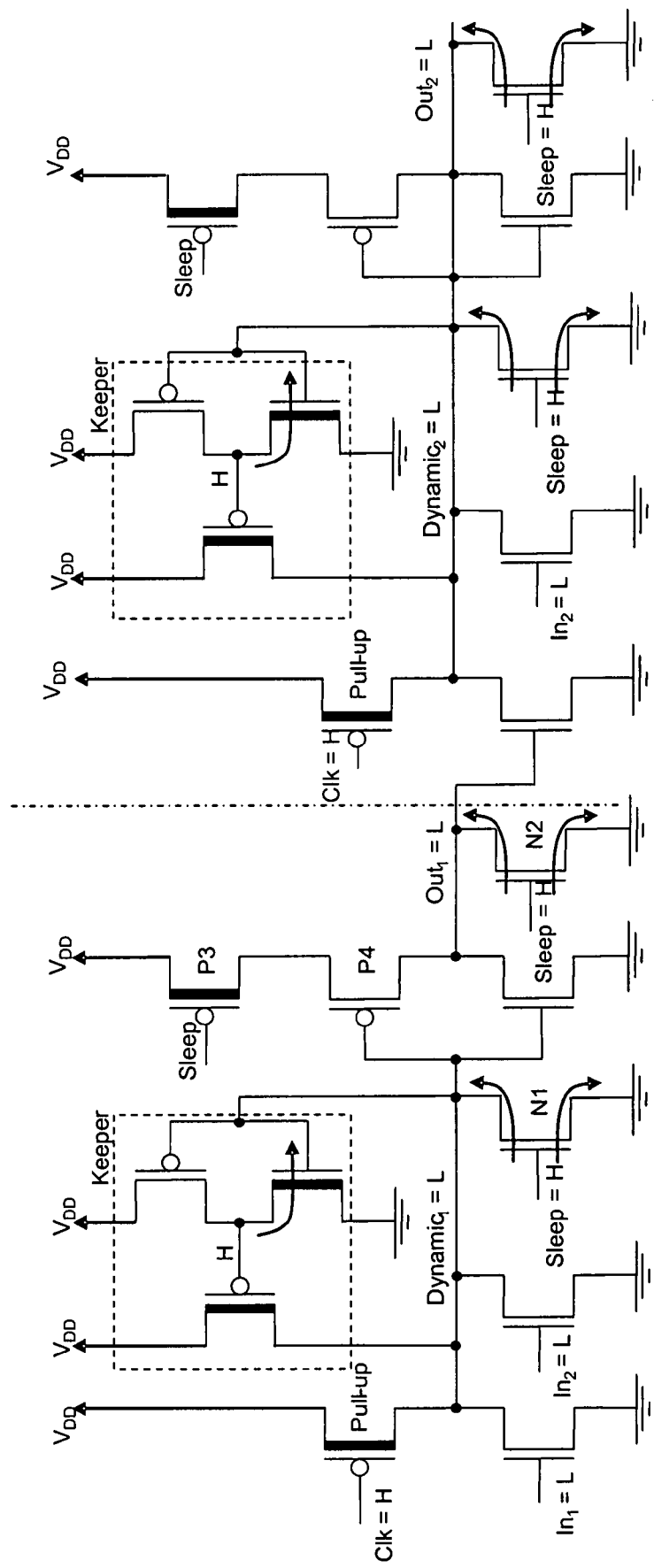
FIG. 1 is a schematic of a prior art multi-stage domino logic circuit.

Provided that a dual-$V_t$ CMOS technology is employed, the noise immunity of a domino logic circuit may be weakened due to the high-$V_t$ keeper transistor. Using low-$V_t$ sleep transistors may further increase the noise vulnerability of the domino circuits since the sleep switches may be turned on by a noise signal coupling to the sleep signal line. Employing high-$V_t$ sleep transistors, therefore, may enhance the noise immunity as compared to the circuit disclosed in FIG. 1. Alternatively, the NMOS sleep transistors (N1 and/or N2 in FIGS. 4 to 6) may have a high-$V_t$. As shown in FIGS. 4 to 6, the PMOS sleep transistor (P3) has a high-$V_t$ to reduce the leakage power consumption. Alternatively, P3 may have a low-$V_t$ to enhance the evaluation speed.

In another aspect, PMOS-only sleep switch dual-$V_t$ domino logic circuits may be used. For the circuit techniques described in FIGS. 4-6, both the dynamic and output nodes may be discharged in the idle mode. The NMOS sleep transistors (N1 and/or N2) may both be in the maximum gate oxide leakage current state. The NMOS sleep switches (N1 and/or N2), therefore, may introduce a gate oxide leakage current overhead. Modifying the circuits disclosed in FIGS. 4-6 may result in a smaller leakage energy overhead. Specifically, only P-type sleep transistors may be employed in order to reduce the gate oxide leakage current overhead of the new sleep switch circuit technique.

Since the gate tunneling current produced by a PMOS transistor is much smaller than an NMOS transistor in a $SiO_2$ based gate insulator CMOS technology, the PMOS-only sleep switch circuit technique may offer a significant reduction in the total leakage current as compared to the previously described circuits. For example, the gate oxide leakage current ($I_{gate}$) by a low-$V_t$ NMOS transistor is 47 times and 30 times higher than $I_{gate}$ produced by a low-$V_t$ PMOS transistor at 110° C. and 25° C., respectively. In a technology utilizing silicon dioxide as the gate dielectric material, the tunneling barrier for holes is significantly higher than the tunneling barrier for electrons. Therefore, the $I_{gate}$ for a PMOS device is lower as compared to an NMOS device with the same physical dimensions (e.g., width, length, $t_{ox}$) and the same voltage difference across the gate insulator. Thus, by using only PMOS sleep transistors to place the domino logic circuit into a low leakage state, the gate-oxide leakage current is further reduced.

Figure 7:
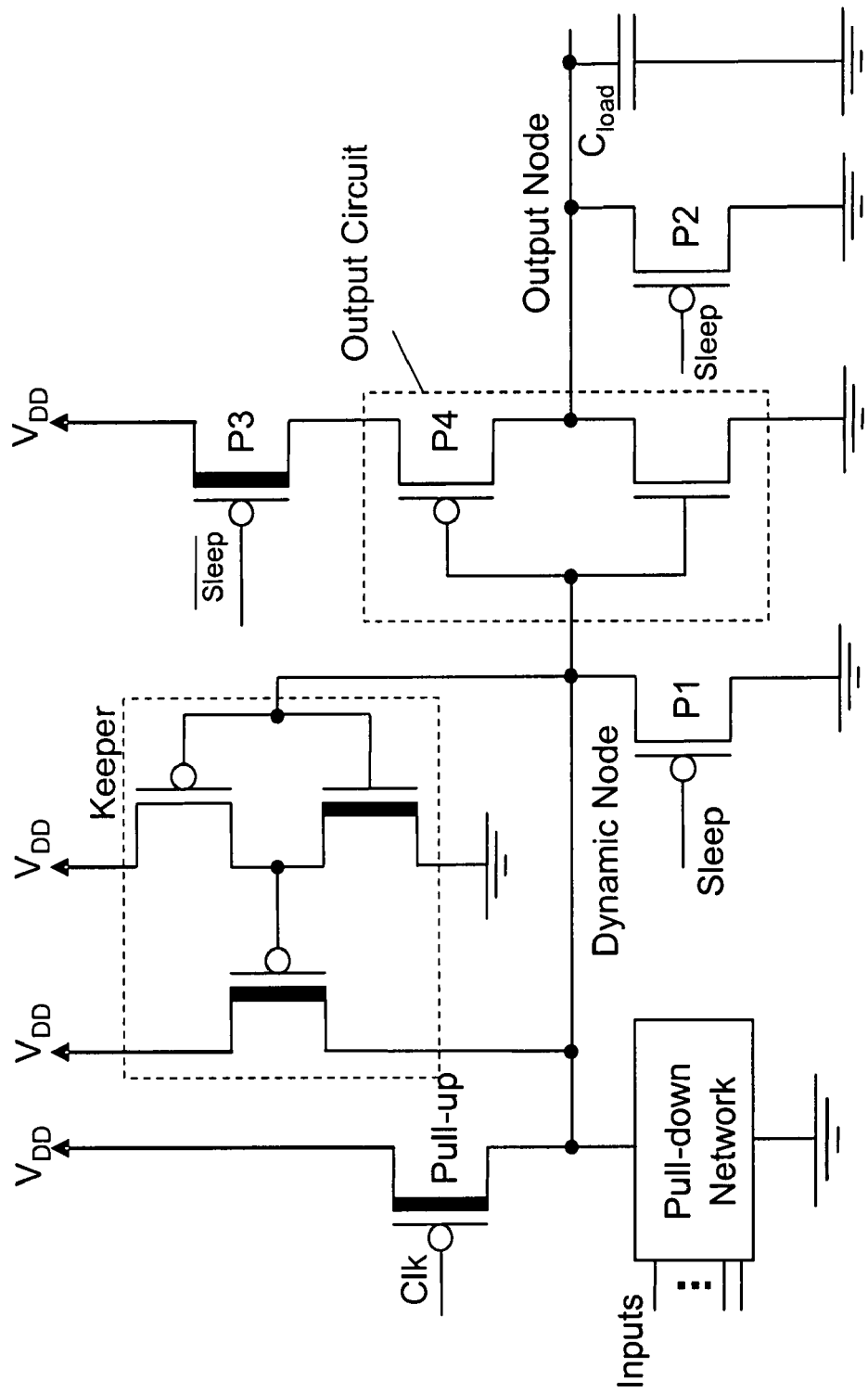
FIG. 7 is a schematic of a footless PMOS-only sleep switch dual-$V_t$ domino gate.
Figure 8:
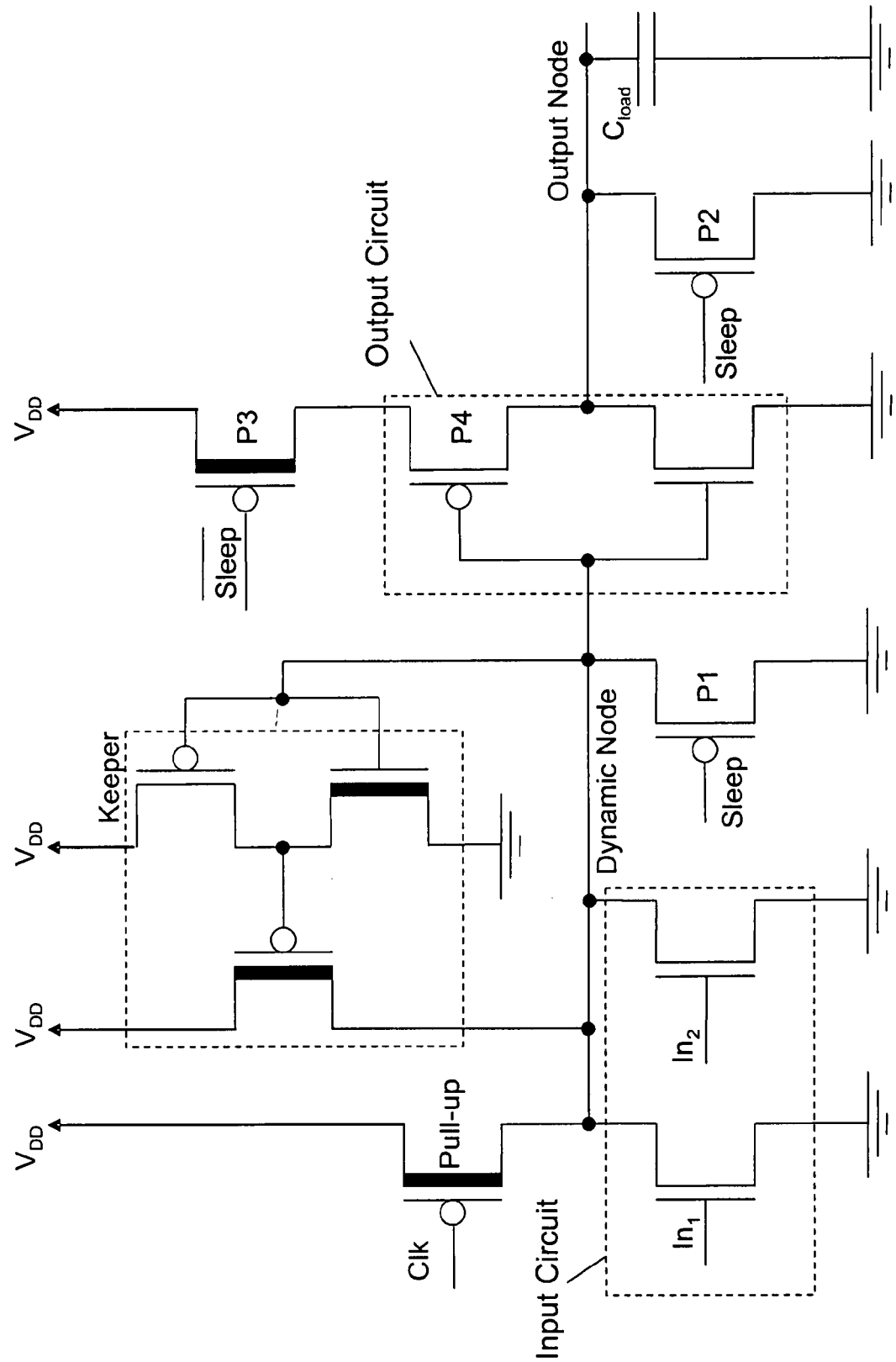
FIG. 8 is a 2-input dual-$V_t$ domino OR gate with low-$V_t$ (P1 and P2) and high-$V_t$ (P3) PMOS sleep transistors.

Examples of the only P-type sleep transistor circuits are shown in FIGS. 7 and 8. FIG. 7 depicts a schematic of a footless PMOS-only sleep switch dual-$V_t$ domino gate. FIG. 8 depicts a 2-input dual-$V_t$ domino OR gate with low-$V_t$ (P1 and P2) and high-$V_t$ (P3) PMOS sleep transistors. Two low-$V_t$ PMOS sleep transistors P1 and P2 may be added to the dynamic and output nodes, respectively. Provided that the dynamic node is discharged in the sleep mode, the PMOS transistor (P4) in the output inverter may be turned on. The output inverter and P2 may produce a static DC current if P4 is directly connected to $V_{DD}$. A high-$V_t$ PMOS sleep transistor (P3) may be employed in series with P4 in order to eliminate the static DC current path through P4 and P2 and to suppress the subthreshold leakage current produced by the output inverter in the sleep mode.

In the active mode, the sleep signal may be set high. P1 and P2 may be cut-off and P3 (driven by the inverted sleep signal) may be turned on. The domino circuit, as shown in FIGS. 7 and 8, may thus operate in the active mode similarly to a standard domino gate. In the standby mode, the clock may be gated high, turning off the high-$V_t$ pull-up transistor. The sleep signal may be set low, turning on P1 and P2. P3 may be cut-off by the inverted sleep signal. The dynamic node may be discharged to a voltage level equal to the threshold voltage of a low-$V_t$ PMOS transistor ($|V_{tplow}|$) through P1. The dynamic and output nodes may eventually be discharged to a steady-state voltage less than $|V_{tplow}|$ (after P1 and P2 are cut-off) by the high subthreshold leakage currents of the low-$V_t$ transistors in the pull-down network and the output inverter. After the node voltages settle to a steady state, some or all of the high-$V_t$ transistors may be strongly cut-off, significantly reducing the subthreshold leakage current. Similarly, the voltages across the gate insulating layers of most of the transistors may be suppressed, thereby lowering the gate oxide leakage current.

Provided that a dual-$V_t$ CMOS technology is employed, the noise immunity of a domino logic circuit may be weakened due to the high-$V_t$ keeper transistor. Using low-$V_t$ sleep transistors may further increase the noise vulnerability of the domino circuits since the sleep switches may be turned on by a noise signal coupling to the sleep signal line. Employing high-$V_t$ sleep transistors, therefore, may enhance the noise immunity as compared to the circuits previously discussed.

Figure 9:
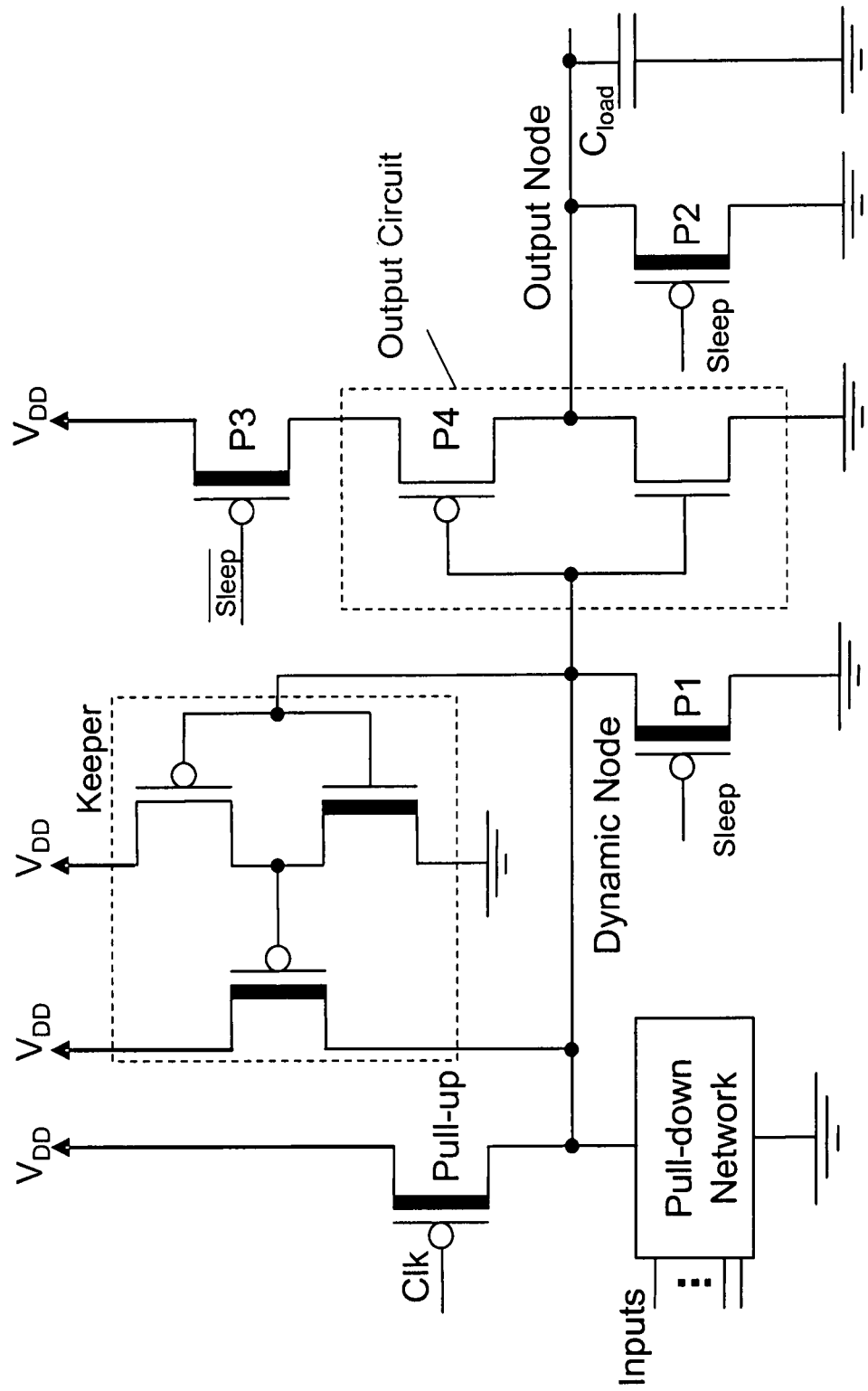
FIG. 9 is a schematic of a footless PMOS-only sleep switch dual-$V_t$ domino gate where the PMOS-only sleep switches are high-$V_t$.
Figure 10:
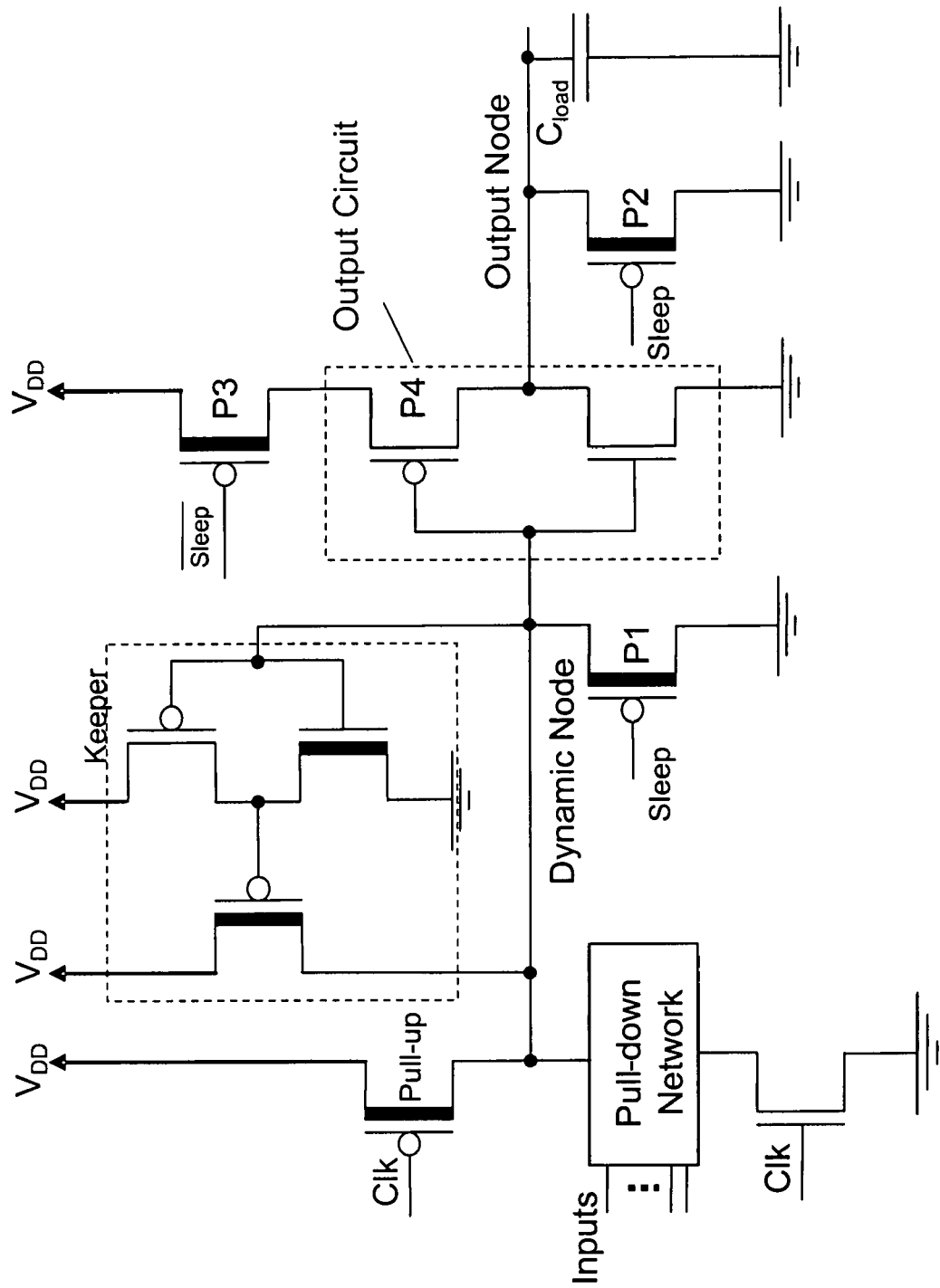
FIG. 10 is a schematic of a footed PMOS-only sleep switch dual-$V_t$ domino gate where the PMOS-only sleep switches are high-$V_t$.

The PMOS sleep transistors (e.g., P1 and P2 in FIG. 7) may be replaced by high-$V_t$ transistors. Examples of circuits with high-$V_t$ PMOS sleep transistors are shown in FIGS. 9 and 10. FIG. 9 depicts a schematic of a footless PMOS-only sleep switch dual-$V_t$ domino gate. FIG. 10 depicts a schematic of a footed PMOS-only sleep switch dual-$V_t$ domino gate.

Figure 11:
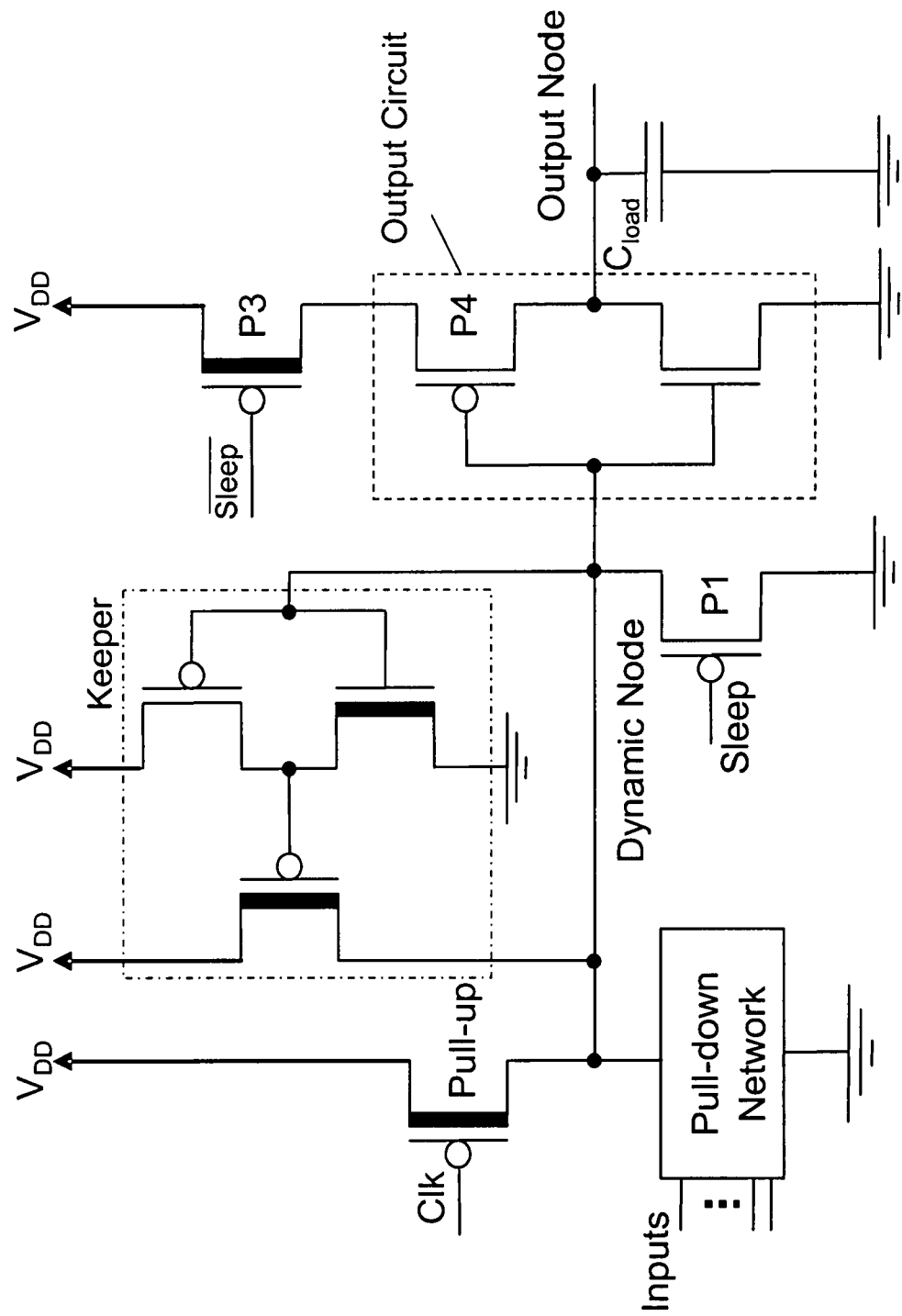
FIG. 11 is a schematic of a footless PMOS-only sleep switch dual-$V_t$ domino gate, where the sleep circuit includes only two PMOS sleep transistors.
Figure 12:
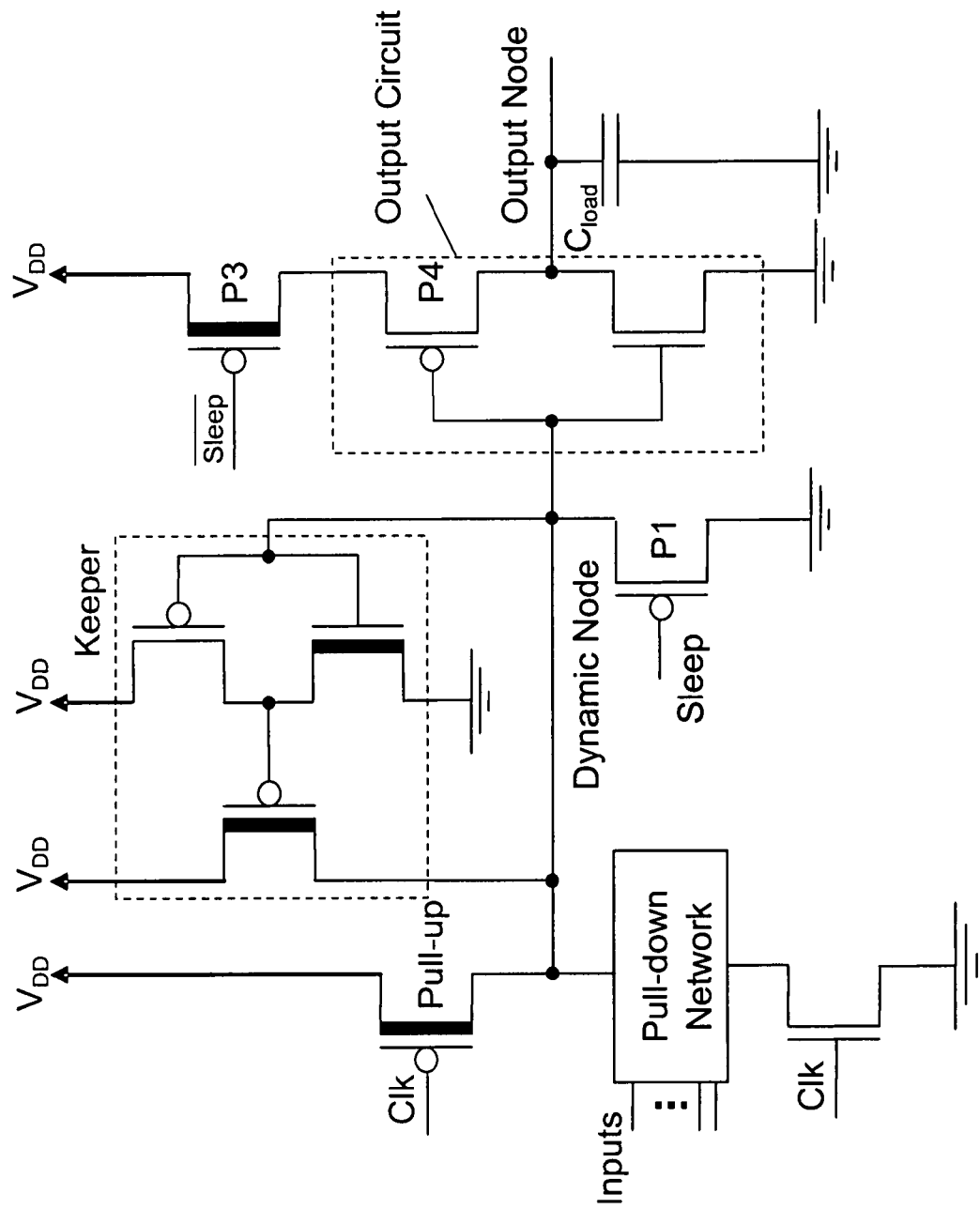
FIG. 12 is a schematic of a footed PMOS-only sleep switch dual-$V_t$ domino gate, where the sleep circuit includes only two PMOS sleep transistors.
Figure 13:
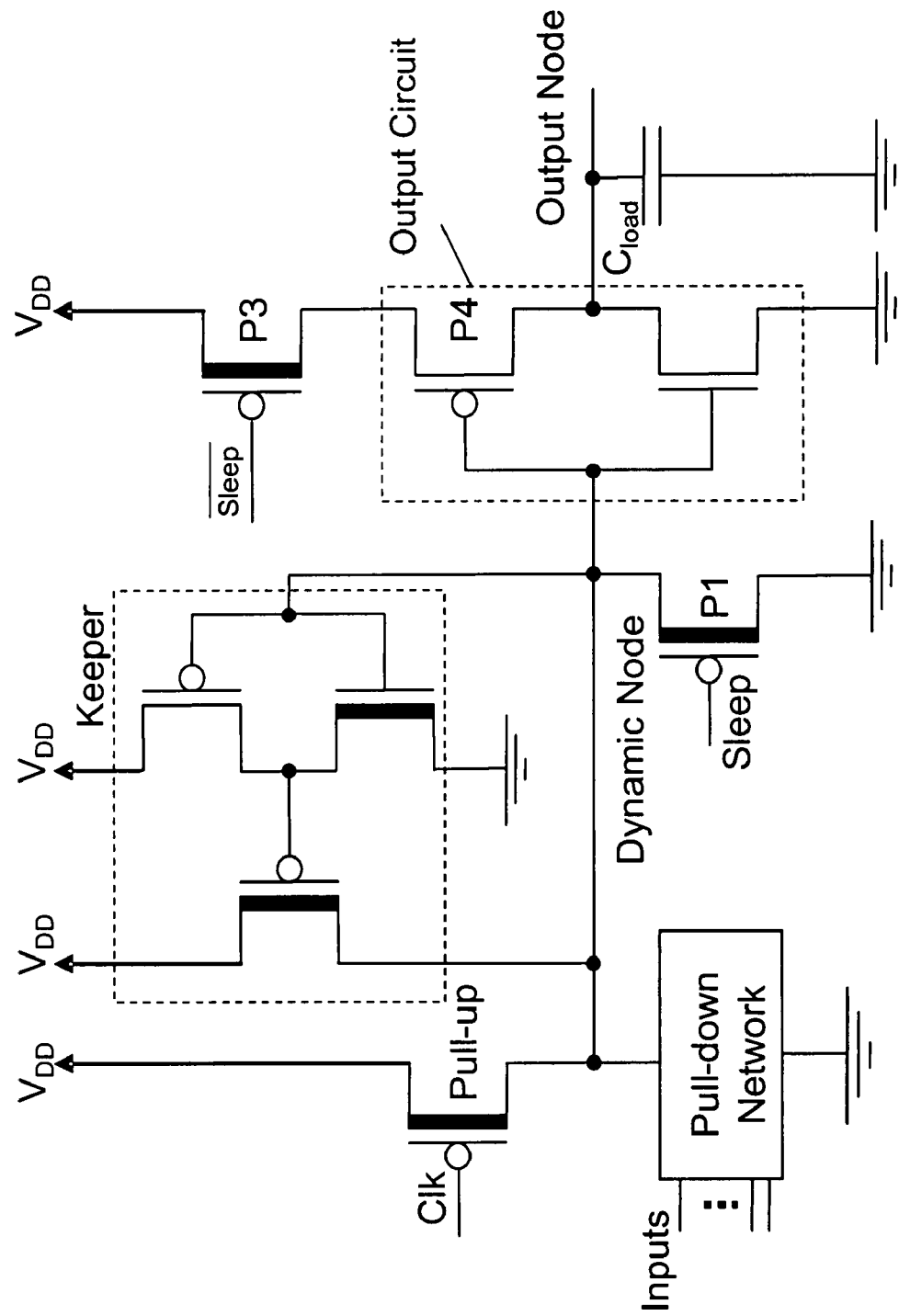
FIG. 13 is a schematic of a footless PMOS-only sleep switch dual-$V_t$ domino gate, where the sleep circuit includes only two high-$V_t$ PMOS sleep transistors.
Figure 14:
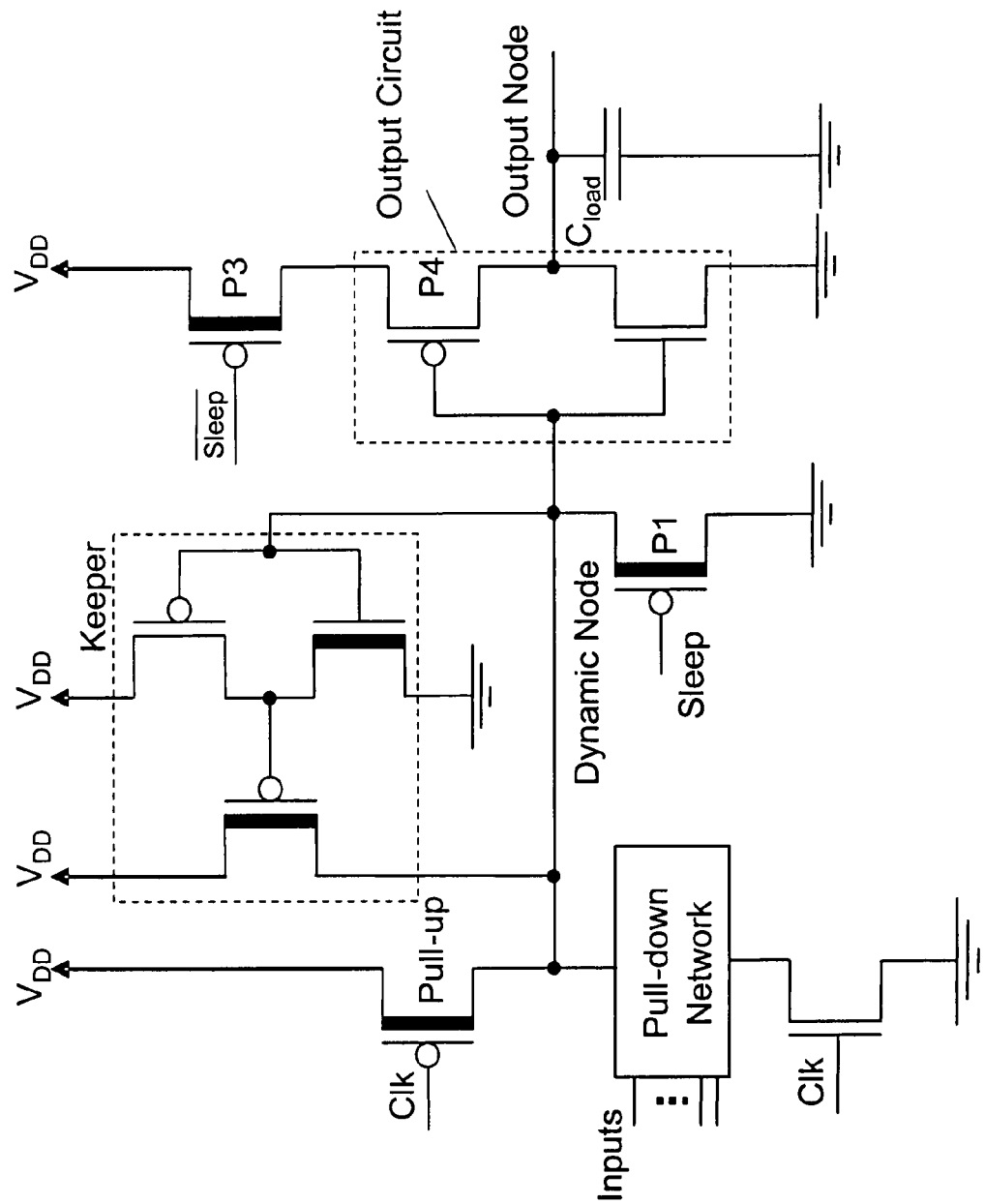
FIG. 14 is a schematic of a footed PMOS-only sleep switch dual-$V_t$ domino gate, where the sleep circuit includes only two high-$V_t$ PMOS sleep transistors.

Examples of other circuits with smaller area, speed, and power overhead are shown in FIGS. 11 and 12. FIG. 11 depicts a schematic of a footless PMOS-only sleep switch dual-$V_t$ domino gate without a sleep switch at the output node. FIG. 12 depicts a schematic of a footed PMOS-only sleep switch dual-$V_t$ domino gate without a sleep switch at the output node. In FIGS. 11 and 12, the sleep switch at the output node of the PMOS-only sleep switch domino gate may be removed, thereby reducing the area overhead, the capacitive load at output node, and the energy overhead for activating/deactivating the sleep transistors. P3 in FIGS. 11 and 12 may be driven by an inverted sleep signal. In the active mode, the sleep signal may be high. The circuits may thus operate in the active mode similarly to a standard domino circuit. In the standby mode, the sleep signal may transition to low. P1 may be turned on and P3 may be cut-off. The dynamic node may be discharged through P1. Since P3 is cut-off, the output node may be discharged by the subthreshold leakage current produced by the output inverter and the gate oxide leakage current conducted by the fan-out gates. Still other examples of sleep switch circuits with high-$V_t$ PMOS sleep transistor at the dynamic node are shown in FIGS. 13 and 14. FIG. 13 depicts a schematic of a footless PMOS-only sleep switch dual-$V_t$ domino gate without a sleep switch at the output node. P1 in FIG. 13 has a high-$V_t$. FIG. 14 depicts a schematic of a footed PMOS-only sleep switch dual-$V_t$ domino gate without a sleep switch at the output node. P1 in FIG. 14 has a high-$V_t$.

Figure 15:
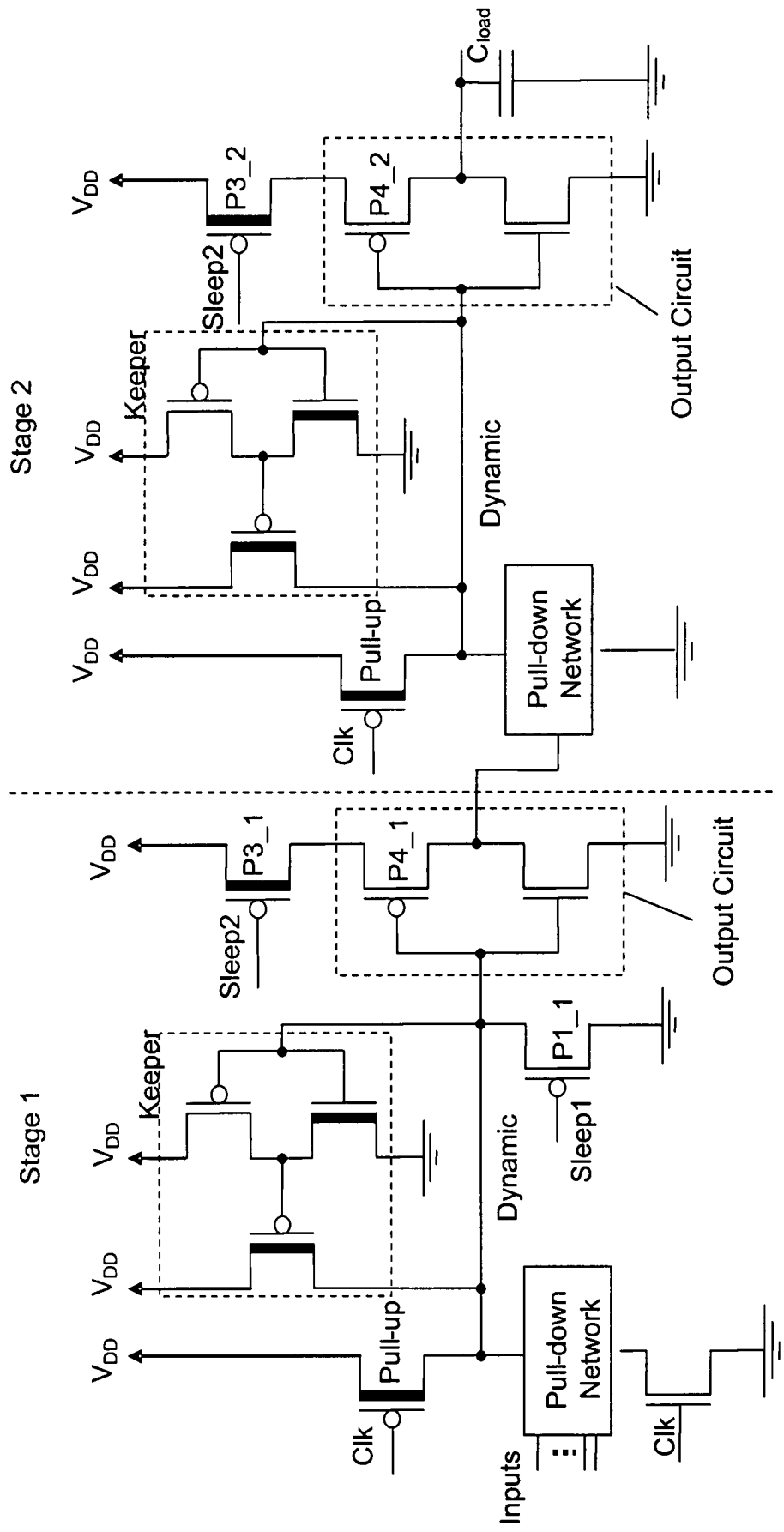
FIG. 15 is a schematic of a multiple stage PMOS sleep switch dual-$V_t$ domino logic circuit without the sleep switches at the dynamic and output nodes in the second and later stages.
Figure 16:
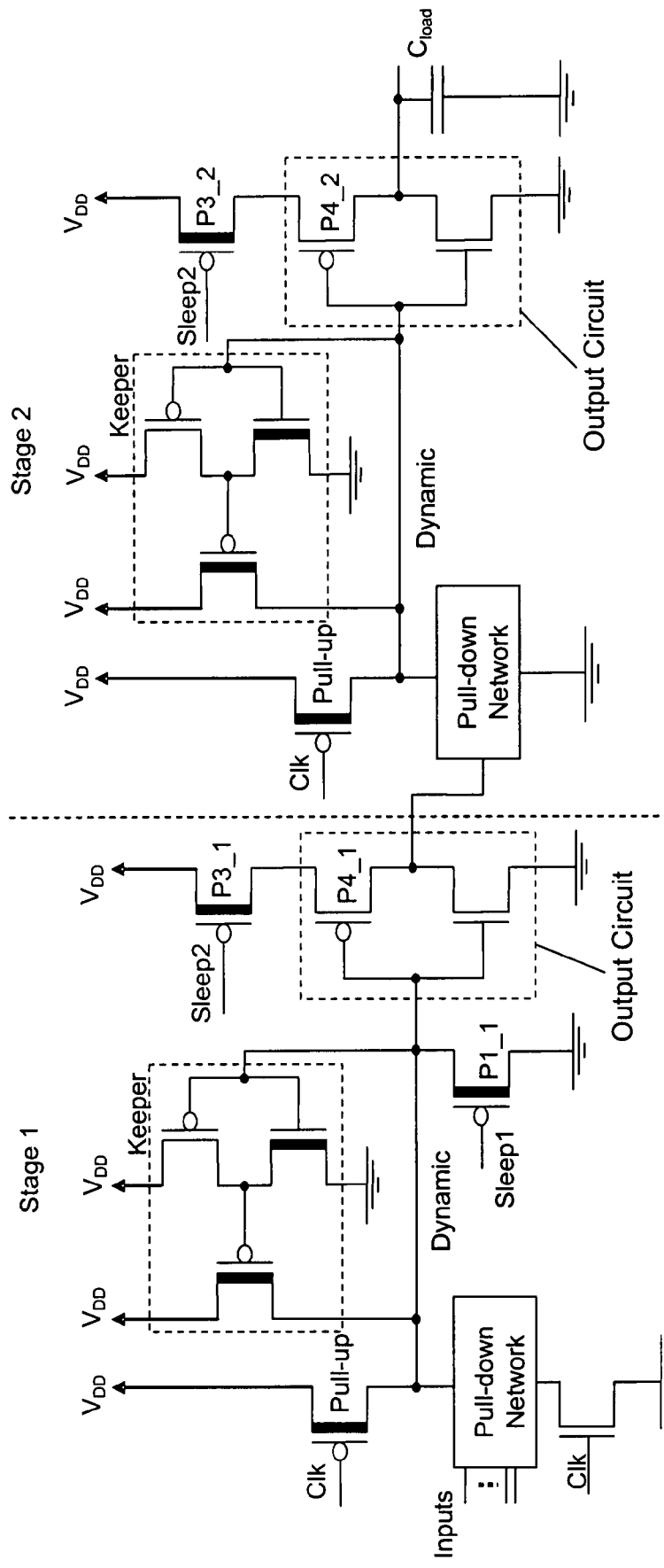
FIG. 16 is a schematic of a multiple stage PMOS sleep switch dual-$V_t$ domino logic circuit without the sleep switches at the dynamic and output nodes in the second and later stages, where the sleep switches are high-$V_t$ PMOS transistors.

To further reduce the number of sleep switches, the sleep transistors at the dynamic nodes of the domino gates in the second and later stages in a multiple stage circuit may also be removed by adjusting the timing of the sleep signals Sleep1 and Sleep2, as illustrated in FIG. 15. FIG. 15 depicts a schematic of a multiple stage PMOS-only sleep switch dual-$V_t$ domino logic circuit without the sleep switches at the dynamic and output node in the second and later stages. P1_1 in FIG. 15 has a low-$V_t$. In the active mode, Sleep1 and Sleep2 may be maintained high and low, respectively. In the idle mode, the clock may be gated high. Sleep1 may transition to low, thereby discharging and charging, respectively, the dynamic and output nodes of the domino gates at the first stage in a domino logic circuit. The high output signals may activate the pull-down network transistors of the fan-out gates. The dynamic and output nodes of the domino gates in the later stages may be discharged and charged, respectively, in a "domino" fashion. After all of the dynamic nodes are discharged, Sleep2 may be asserted to cut-off the pull-up path of all of the output inverters in the domino logic circuits. Finally, the output nodes may be discharged by the subthreshold leakage current produced by the output inverter and the gate oxide leakage current conducted by the fan-out gates. The PMOS sleep switch at the pull-up path of the output inverter may also be shared by multiple gates in order to reduce the circuit area and sleep mode implementation energy overheads. Alternatively, a sleep switch circuit with high-$V_t$ PMOS sleep transistor at the dynamic node may be used, as shown in FIG. 16. FIG. 16 depicts a schematic of a multiple stage PMOS-only sleep switch dual-$V_t$ domino logic circuit without the sleep switches at the dynamic and output node in the second and later stages. P1_1 in FIG. 16 has a high-$V_t$.

In still another aspect, leakage current starved domino logic circuits are disclosed. For the circuits previously described, at least two sleep switches and an extra inverter (in the keeper circuit) may be used for each domino gate. The sleep switches and extra inverter may introduce energy, area, and speed overheads. Alternatively, a single sleep switch may be used to reduce overhead.

Figure 2:
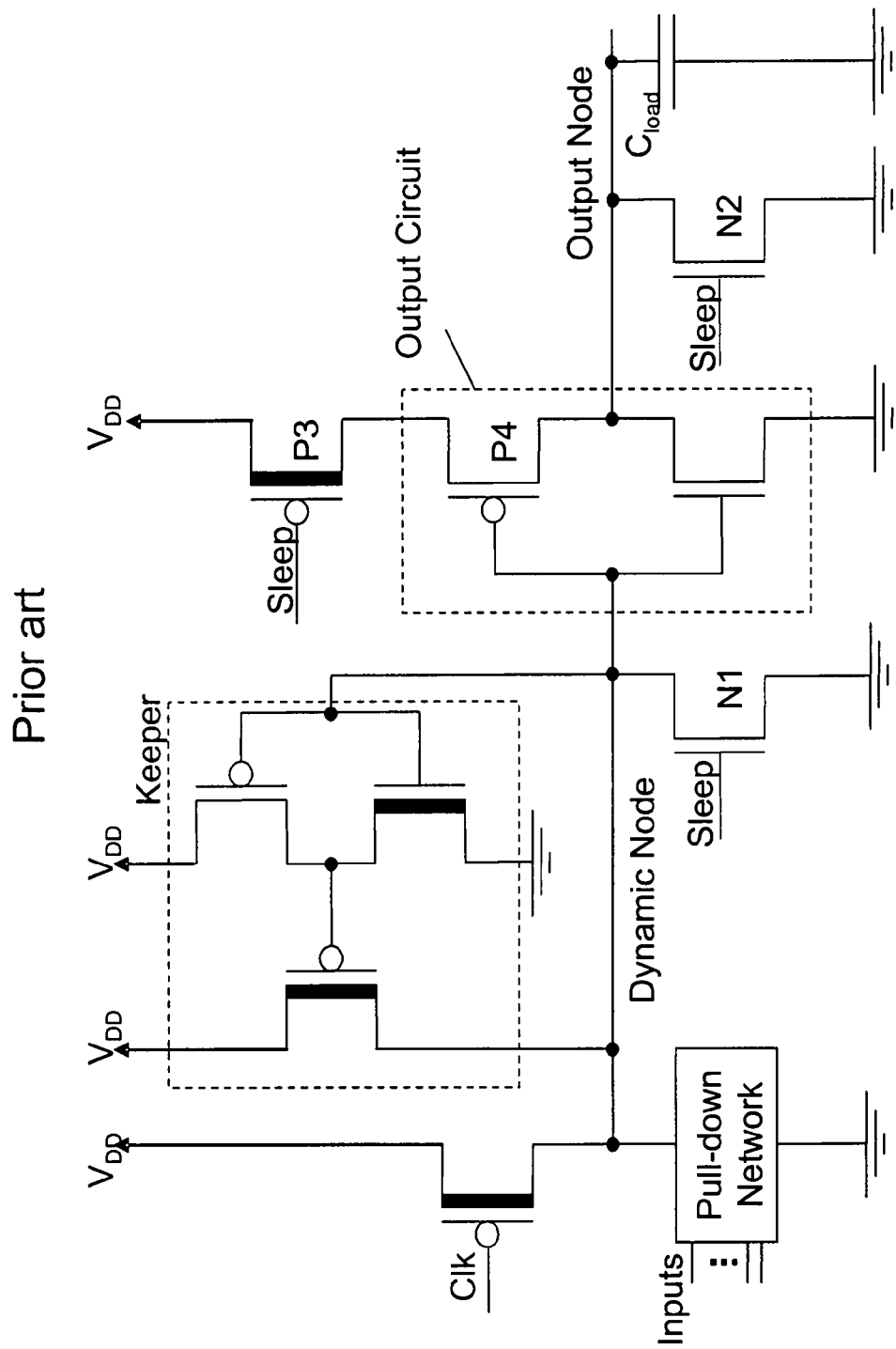
FIG. 2 is a schematic of a single stage of the domino logic circuit depicted in FIG. 1.
Figure 3:
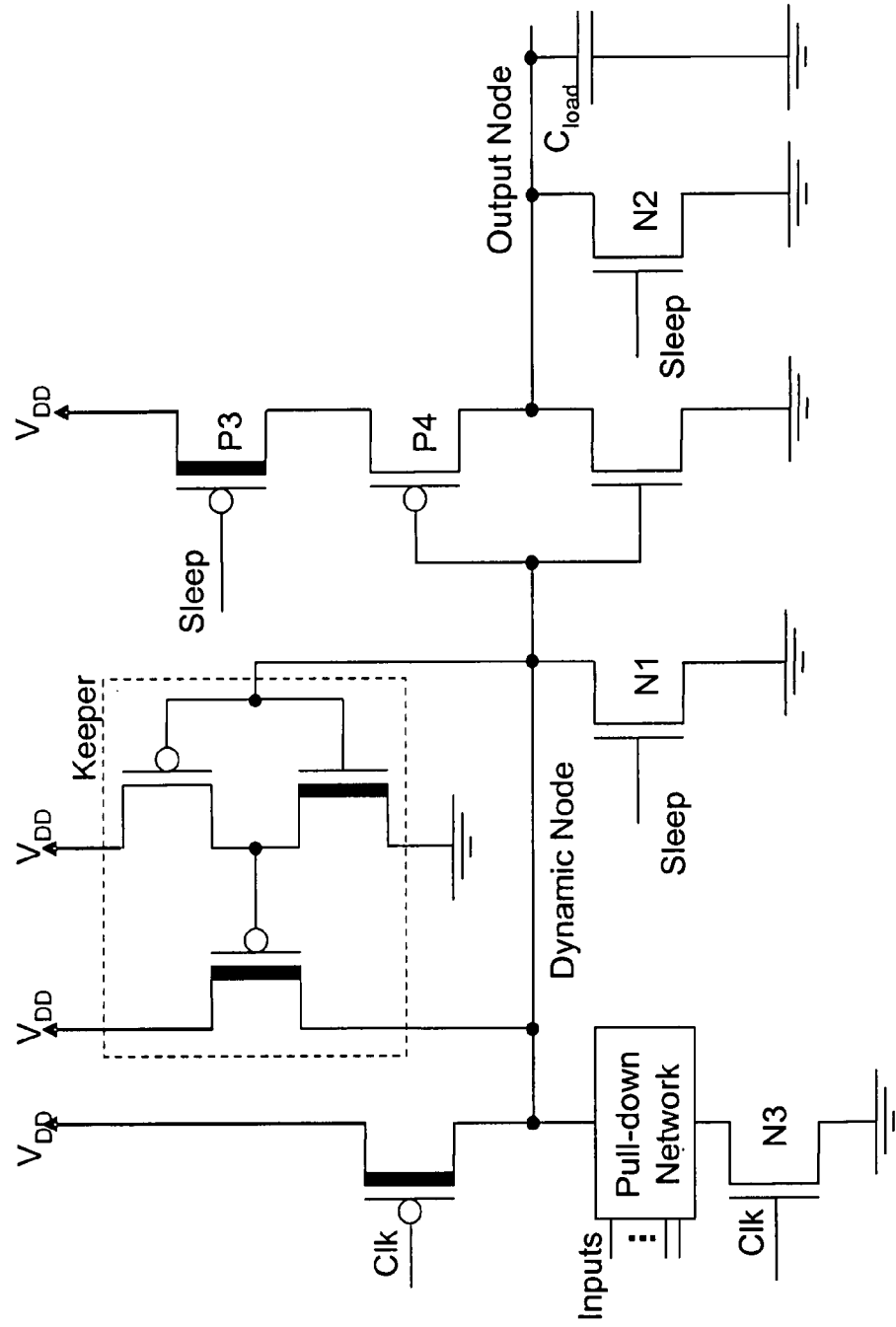
FIG. 3 is a schematic of a single stage of the domino logic circuit depicted in FIG. 1 with a foot transistor (N3).
Figure 17:
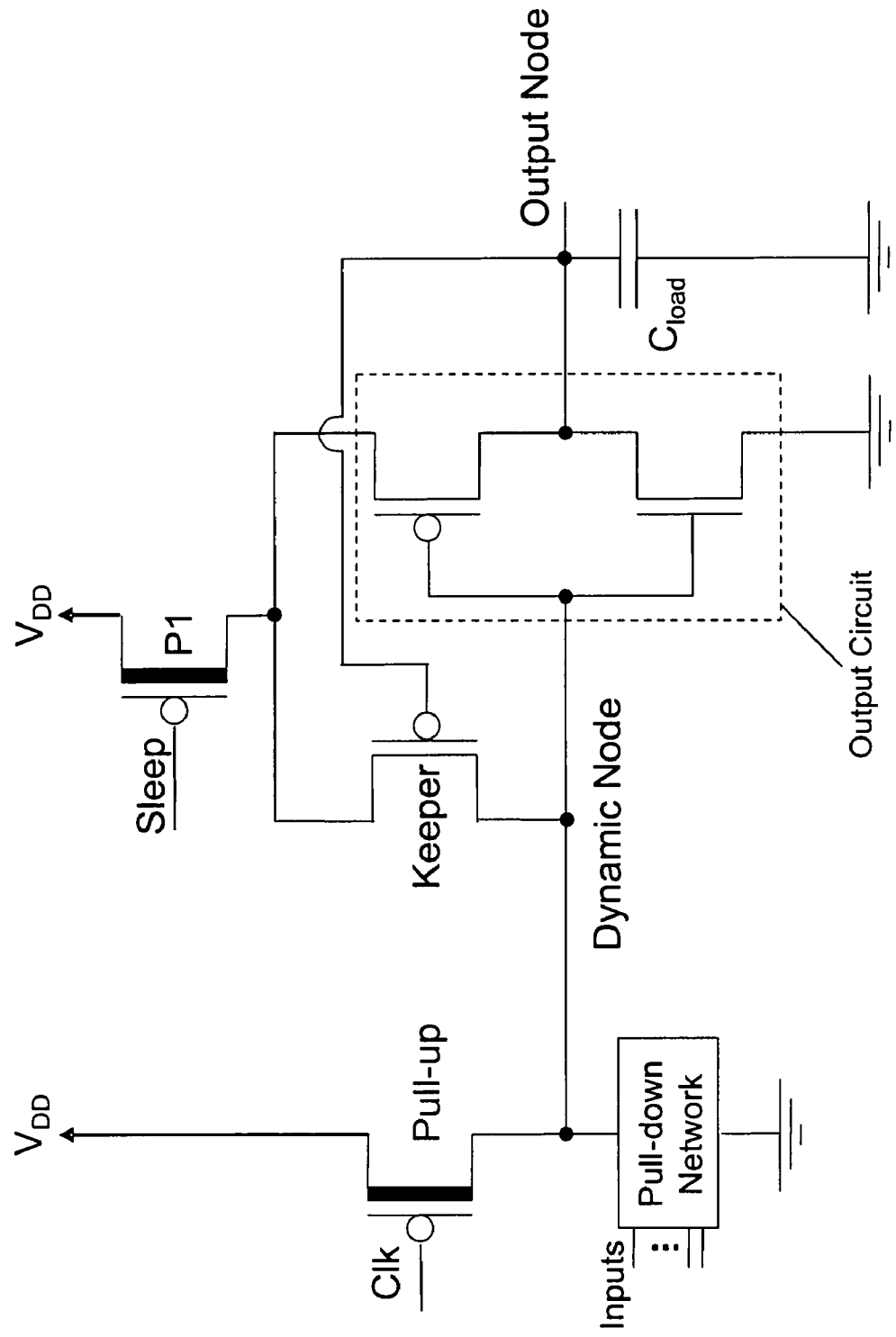
FIG. 17 is a schematic of a footless single stage domino logic circuit where the sleep circuit consists of a single PMOS transistor.
Figure 18:
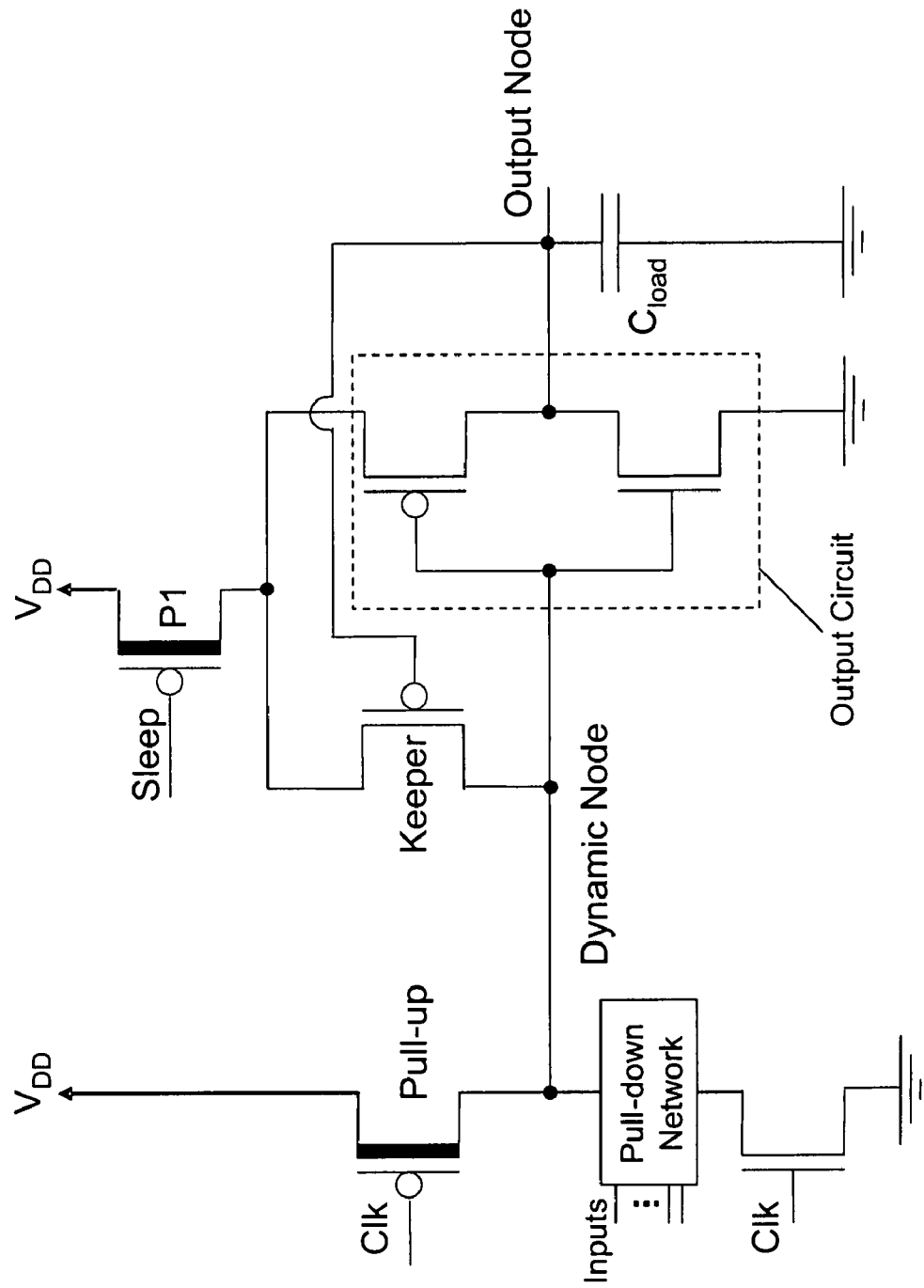
FIG. 18 is a schematic of a footed single stage domino logic circuit where the sleep circuit consists of a single PMOS transistor.

Example circuits are illustrated in FIGS. 17 and 18. FIG. 17 depicts a schematic of a footless leakage current starved sleep switch dual-$V_t$ domino logic circuit. FIG. 18 depicts a schematic of a footed leakage current starved sleep switch dual-$V_t$ domino logic circuit. A high-$V_t$ PMOS sleep transistor (P1) may be employed in order to cut-off the $V_{DD}$ connection to the output inverter and the keeper during the sleep mode. In addition to reducing the number of sleep switches required for low-leakage sleep mode, this circuitry also does not require an extra inverter, which may be necessary for driving the keeper in FIGS. 1-16, thereby reducing the active mode power and speed overhead. For example, the keeper circuit depicted in FIG. 2 includes an inverter in series with a transistor. In contrast, the Keeper circuit depicted in FIGS. 17-19 consists of a single keeper transistor, with the input to the gate of the keeper transistor being the output node of the output circuit. Thus, unlike previous domino logic circuits that include sleep transistors, the domino logic circuits depicted in FIGS. 17-19 include a keeper circuit that includes a single transistor and that has as its input the output node.

In the active mode, the sleep signal may be set low. P1 may be turned on. The domino gate may operate similar to a standard dual-$V_t$ domino circuit. In the standby mode, the clock may be gated high, turning off the high-$V_t$ pull-up transistor. The sleep signal may be set high, cutting off P1. The dynamic node may be discharged by the initially high subthreshold leakage currents of the low-$V_t$ NMOS transistors in the pull-down network. Similarly, the output node may be discharged by the initially high subthreshold leakage current of low-$V_t$ NMOS transistor in the output inverter and the gate tunneling current of NMOS transistors in the pull-down networks of fan-out gates. In steady state, the dynamic and output nodes may be maintained at a low voltage due to the significantly higher subthreshold resistance of the high-$V_t$ pull-up and sleep transistors as compared to the low-$V_t$ pull-down transistors. After the node voltages settle to a steady state, voltages across the gate insulating layers of all of the important NMOS transistors may be suppressed, thereby lowering gate oxide leakage current. Similarly, the high-$V_t$ pull-up and sleep transistors may be strongly cut-off, significantly reducing subthreshold leakage current with the current starved dual-$V_t$ domino logic circuit technique.

To further reduce the number of sleep switches in a domino logic circuit, one sleep transistor (P1) may be shared by some or all of the domino gates in a multiple-stage domino circuit, as illustrated in FIG. 19. FIG. 19 depicts a schematic of a multiple-stage leakage current starved dual-$V_t$ domino logic circuit with a shared sleep switch. Though only two stages are illustrated in FIG. 19, more stages may be used. Sharing the sleep transistor P1 may reduce the area and energy overhead. As shown in FIG. 19, the sleep transistor P1 may be in the circuit path between $V_{DD}$ and the output circuit in the first stage (such as directly connected between $V_{DD}$ and the output circuit). The sleep transistor P1 may also be in the circuit path between $V_{DD}$ and the keeper circuit (the keeper transistor) in the first stage (such as directly connected between $V_{DD}$ and the keeper transistor). In addition, the parts of the second stage may be connected to the sleep transistor, including the keeper transistor and the output circuit, as shown in FIG. 19. Using the sleep transistor P1 in the manner depicted in FIG.

19 enables a significant reduction in the area and circuitry required to reduce the leakage current. Further, because the multi-stage domino circuit may operate in stages, the size of the sleep transistor P1 in FIG. 19 may be on the order of other transistors in domino circuit. In particular, the sleep transistor P1 may not need to drive the keeper transistors and output circuits in the various stages at the same time, but may drive the keeper transistor and output circuits in the various stages at separate times. In this way, the size of the sleep transistor P1 may need to be only slightly larger than the size of other transistors in the domino logic circuit.

It is therefore intended that the foregoing detailed description be regarded as illustrative rather than limiting, and that it be understood that it is the following claims, including all equivalents, that are intended to define the spirit and scope of this invention. Other variations may be readily substituted and combined to achieve particular design goals or accommodate particular materials or manufacturing processes.

We claim:

1. A domino logic circuit comprising:
   a precharge circuit for precharging a dynamic node to a predetermined value;
   an input circuit having at least one input and at least one output, the at least one output in communication with the dynamic node, the input circuit comprising logic for determining a value of the dynamic node based on the at least one input;
   an output circuit having at least one input and at least one output, the at least one input in communication with the dynamic node;
   a keeper circuit for keeping the dynamic node at the predetermined value after the precharge circuit precharges the dynamic node to the predetermined value, the keeper circuit consisting of a single keeper transistor; and
   a sleep circuit for reducing current to at least one of the output circuit or the keeper circuit during a sleep mode, the sleep circuit being in a circuit path between a supply voltage and the single keeper transistor.

2. The domino logic circuit of claim 1, wherein the keeper circuit includes an input that is connected to the output of the output circuit.

3. The domino logic circuit of claim 1, wherein the sleep circuit consists of a sleep transistor in a circuit path between a supply voltage and the single keeper transistor; and
   wherein the sleep transistor during a sleep mode inhibits a static DC current path through the single keeper transistor.

4. The domino logic circuit of claim 3, wherein the domino logic circuit comprises multiple stages, each stage including a precharge circuit, an input circuit, an output circuit, a keeper circuit and a sleep circuit consisting of a single sleep transistor.

5. The domino logic circuit of claim 4, wherein the multiple stages of the domino logic circuit use the same single sleep transistor to inhibit a static DC current path in each of the keeper circuits of the multiple stages.

6. The domino logic circuit of claim 1, wherein the sleep circuit consists of a sleep transistor in a circuit path between a supply voltage and the single keeper transistor and in a circuit path between a supply voltage and the output circuit; and wherein the sleep transistor during a sleep mode inhibits a static DC current path through the output circuit.

7. The domino logic circuit of claim 1, wherein the sleep circuit consists of a single sleep transistor in a circuit path between a supply voltage and the output circuit and in a circuit path between the supply voltage and the single keeper transistor.

8. The domino logic circuit of claim 7, wherein the domino logic circuit comprises multiple stages, each stage including a precharge circuit, an input circuit, an output circuit, a keeper circuit and a sleep circuit consisting of a single sleep transistor; and wherein the multiple stages of the domino logic circuit use the same single sleep transistor to inhibit a static DC current path in each of the keeper circuits and the output circuits of the multiple stages.

* * * * *